(12) United States Patent
Teratani et al.

(10) Patent No.: US 7,148,166 B2
(45) Date of Patent: Dec. 12, 2006

(54) ALUMINUM NITRIDE CERAMICS AND A MEMBER USED FOR THE PRODUCTION OF SEMICONDUCTORS

(75) Inventors: Naomi Teratani, Nagoya (JP); Yuji Katsuda, Stuttgart (DE)

(73) Assignee: NGK Insulators, Ltd., Nagoya (JP)

( * ) Notice: Subject to any disclaimer, the term of this patent is extended or adjusted under 35 U.S.C. 154(b) by 11 days.

(21) Appl. No.: 10/704,997

(22) Filed: Nov. 10, 2003

(65) Prior Publication Data

US 2004/0096706 A1  May 20, 2004

(30) Foreign Application Priority Data

Nov. 14, 2002 (JP) ............................ P2002-330707
Sep. 17, 2003 (JP) ............................ P2003-324312

(51) Int. Cl.
*C04B 35/581* (2006.01)
*C04B 35/582* (2006.01)
(52) U.S. Cl. ...................................... 501/98.4; 501/98.6
(58) Field of Classification Search ............... 501/98.4, 501/98.6; 428/697, 698, 325
See application file for complete search history.

(56) References Cited

U.S. PATENT DOCUMENTS

| 5,705,450 A * | 1/1998 | Chiao ........................ 501/98.6 |
| 6,607,836 B1 | 8/2003 | Katsuda et al. |
| 2002/0110709 A1 | 8/2002 | Katsuda et al. |
| 2002/0165079 A1* | 11/2002 | Katsuda et al. ............ 501/98.4 |
| 2003/0203804 A1 | 10/2003 | Teratani et al. |

FOREIGN PATENT DOCUMENTS

| JP | 9-315867 | 12/1997 |
| JP | 10-154746 | 6/1998 |
| JP | 1078902 | * 2/2001 |

OTHER PUBLICATIONS

U.S. Appl. No. 10/785,774, filed Feb. 24, 2004, Kobayashi et al.

* cited by examiner

*Primary Examiner*—Karl Group
(74) *Attorney, Agent, or Firm*—Burr & Brown

(57) ABSTRACT

An aluminum nitride ceramic having a low volume resistivity at room temperature and a relatively low samarium content is provided. The aluminum nitride ceramic contains aluminum nitride as a main component and samarium in a converted content, calculated as samarium oxide, of 0.060 mole percent or lower. The aluminum nitride ceramic includes aluminum nitride particles and a samarium-aluminum composite oxide phase having a length of at least 7 μm.

15 Claims, 12 Drawing Sheets

US 7,148,166 B2

ALUMINUM NITRIDE CERAMICS AND A MEMBER USED FOR THE PRODUCTION OF SEMICONDUCTORS

This application claims the benefits of Japanese Patent Applications P2002-330707, filed on Nov. 14, 2002 and P2003-324312, filed on Sep. 17, 2003, the entireties of which are incorporated herein by reference.

BACKGROUND OF THE INVENTION

1. Field of the Invention

The invention relates to an aluminum nitride ceramics and a member for use in the production of semiconductors.

2. Related Art Statement

An electrostatic chuck system utilizing the Johnson-Rahbek effect is useful for the adsorption and retention of semiconductor wafers. In such a system, the volume resistivity of the substrate of the chuck is preferably $10^8$ to $10^{13}$ $\Omega \cdot cm$ for improved adsorption force and speed of response. It is therefore desirable to control the volume resistivity of the substrate within $10^8$ to $10^{13}$ $\Omega \cdot cm$ in the temperature range intended for use, in the development of an electrostatic chuck.

The applicant filed Japanese patent publication No. 9-315867A and disclosed that the volume resistivity of aluminum nitride with a high purity may be adjusted to $10^8$ to $10^{13}$ $\Omega \cdot cm$ at room temperature by adding a small amount of yttrium oxide thereto. The effects of the addition of a rare earth elements other than yttrium into an aluminum nitride sintered body on its volume resistivity was not studied in the Japanese patent publication No. 9-315867A.

Japanese patent publication No. 63-46032B discloses a process for producing an aluminum nitride sintered body. According to the claim 1, aluminum nitride powder containing 1 weight percent of oxygen is mixed with 0.01 to 15 weight percent of the oxide of a metal element selected among yttrium, lanthanum, praseodymium, niobium, samarium, gadolinium and dysprosium to obtain mixed powder. The powder is then shaped and sintered to obtain an aluminum nitride sintered body having a high thermal conductivity and containing 0.01 to 20 weight percent of oxygen. According to "example 1" in the publication, aluminum nitride powder (with a mean particle diameter of 1 μm) containing 1 weight percent of oxygen is mixed with 3 weight percent of samarium oxide to obtain mixed powder. The powder is then subjected to hot press at a pressure of 300 kg/cm² and a temperature of 1800° C. for 1 hour to obtain a sintered body with a thermal conductivity of 121 W·m/k at room temperature.

In Japanese patent publication 63-46032A, a rare earth element is added to raw powder of aluminum nitride for improving the thermal conductivity of the resultant aluminum nitride sintered body, but the effect of the addition on the volume resistivity of the sintered body was not studied. Further, in Japanese patent publication 63-46032A, samarium oxide is added to raw material of aluminum nitride in a content of 3 weight percent calculated as samarium to obtain mixture, which is then hot pressed to obtain an aluminum nitride sintered body, but the change of the volume resistivity of the sintered body due to the addition of samarium oxide was not studied.

Further, the applicant disclosed, in a U. S. Patent publication 2002-0110709A1 (now U.S. Pat. No. 6,607,836), an aluminum nitride sintered body having a content of samarium of 0.04 mol percent or more so that the body has a samarium-aluminum oxide phase. The oxide phase is interconnected to result in a volume resistivity at room temperature of $10^{12}$ $\Omega \cdot cm$ or lower. According to the description in U. S. Patent publication 2002-0110709A1 (now U.S. Pat. No. 6,607,836), however, it is necessary that the body contains 0.04 mole percent or more of samarium calculated as samarium oxide, for attaining a volume resistivity at room temperature of about $10^{12}$ $\Omega$ cm. As the content of samarium is larger, the volume resistivity at room temperature is lower. U. S. Patent publication 2002-0110709A, however, does not disclose any microstructure having a samarium-aluminum composite oxide phase of a length of 7 μm or longer formed with a such a small content of samarium.

However, in an application for producing semiconductors such as a substrate for an electrostatic chuck, it is indispensable to eliminate the contamination of the semiconductors by metal elements. It is thus desirable to reduce the content of a heavy metal other than aluminum in the aluminum nitride sintered body as possible.

SUMMARY OF THE INVENTION

An object of the invention is to provide an aluminum nitride ceramic having a low volume resistivity at room temperature and a relatively low content of samarium.

The present invention provides an aluminum nitride ceramic comprising aluminum nitride as a main component and samarium in a converted content calculated as samarium oxide of 0.060 mole percent or lower, wherein aluminum nitride particles and a samarium-aluminum composite oxide phase having a length of 7 μm or more are formed.

The inventors have studied an aluminum nitride ceramic containing samarium with a samarium-aluminum oxide phase. They have found that, in such ceramics, it is possible to reduce the volume resistivity at room temperature to a sufficiently low value, for example not higher than $10^{12}$ $\Omega \cdot cm$, provided that the samarium aluminum oxide phase is sufficiently grown to a length of 7 μm or more, even when the content of samarium is low. It is thus possible to provide an aluminum nitride ceramic having a relatively low content of samarium, reduced possibility of metal contamination and a sufficiently low volume resistivity at room temperature.

The present invention further provides an aluminum nitride ceramic comprising aluminum nitride as a main component and samarium in a converted content calculated as samarium oxide of 0.060 mole percent or lower, wherein aluminum nitride particles having a mean particle diameter of 5 μm or more and a samarium-aluminum composite oxide phase are formed.

The inventors have studied an aluminum nitride ceramic containing samarium with a samarium-aluminum composite oxide phase. They have found that, in such ceramics, it is possible to reduce the volume resistivity at room temperature at a sufficiently low value, for example $10^{12}$ $\Omega \cdot cm$ or lower, provided that the content of samarium is 0.025 mole percent or higher and 0.06 mole percent or lower. It is thus possible to provide an aluminum nitride ceramic having a relatively low content of samarium, reduced possibility of metal contamination and a sufficiently low volume resistivity at room temperature.

The present invention further provides an aluminum nitride ceramic comprising aluminum nitride as a main component and samarium in a converted content calculated as samarium oxide of 0.060 mole percent or lower, wherein aluminum nitride particles and a samarium-aluminum composite oxide phase are formed. The aluminum nitride ceramic is obtained by a sintering process at a maximum temperature of at least 1850° C.

The inventors have studied an aluminum nitride ceramic containing samarium for generating a samarium-aluminum composite oxide phase. Even when the content of samarium is low, the volume resistivity at room temperature of the ceramics may be reduced to a low value, such as $10^{12}$ Ω·cm or lower, by sufficiently elevating the maximum temperature during the sintering step to 1850° C. or higher. It is thus possible to provide an aluminum nitride ceramic having a relatively low content of samarium, reduced possibility of metal contamination and a sufficiently low volume resistivity at room temperature. Such high maximum temperature during the sintering step accelerates the growth of aluminum nitride particles and the samarium-aluminum composite oxide phase to help the formation of interconnected conductive path of the samarium-aluminum composite oxide phase.

BRIEF DESCRIPTION OF THE DRAWINGS

These and other objects, features and advantages of the invention will be appreciated upon reading the following detailed description of the invention, taken in conjunction with the attached drawings, with the understanding that some modifications, variations and changes of the same could be easily made by the skilled person in the art.

DETAILED DESCRIPTION OF THE INVENTION

Figure 1:
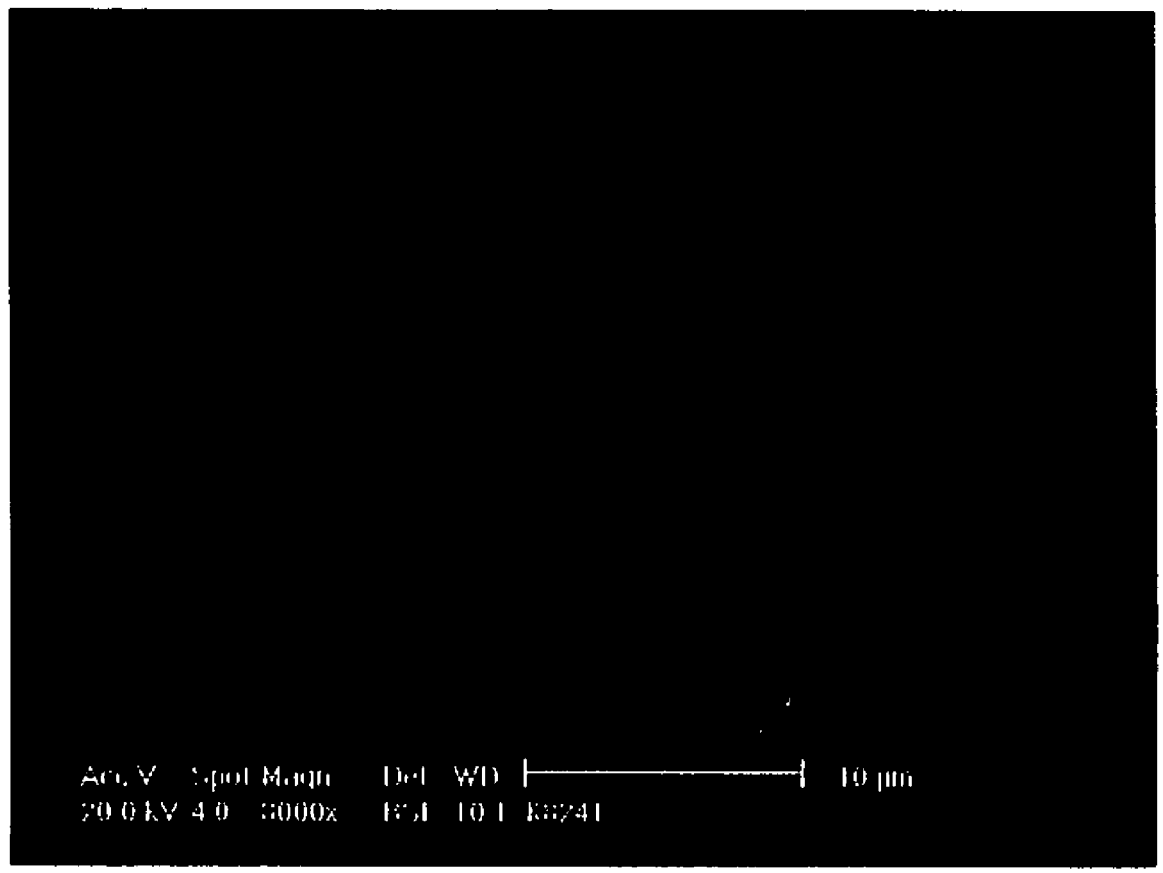
FIG. 1 is a photograph showing the microstructure of a sintered body according to Example 1.

The content of aluminum in the aluminum nitride sintered body should be enough to form aluminum nitride particles as the main phase. The content is preferably not lower than 35 weight percent, and more preferably, not lower than 50 weight percent, of the sintered body.

In a preferred embodiment of the present invention, the samarium-aluminum composite oxide phase forms a network microstructure. In other words, the intergranular layers made of the samarium-aluminum composite oxide are formed along the interfaces (intergranular phase) between aluminum nitride grains. The intergranular layers surrounding two adjacent aluminum nitride particles are continuously formed. Such a network microstructure may be confirmed by EPMA.

The content of carbon in the aluminum nitride ceramic according to the invention is preferably not higher than 0.05 weight percent. The relative density of the aluminum nitride ceramic is preferably not lower than 95 percent.

For providing a sintered body suitable for applications in which the contamination of impurities is to be highly controlled (such as an application for producing semiconductors), the total content of metal elements, excluding aluminum and all the rare earth elements (including samarium), is preferably not higher than 100 ppm, in some cases. The total content is more preferably not higher than 50 ppm in some cases.

The samarium-aluminum composite oxide phase preferably contains a $SmAl_{11}O_{18}$ phase, and most preferably does not contain $SmAlO_3$ phase or contains only a small amount of $SmAlO_3$ phase. The phases may be identified by an X-ray diffraction system using the conditions described in the "Examples" section referring to a phase diagram.

Preferably, the samarium-aluminum composite oxide phase has a $SmAlO_3$ phase content of 2 percent or lower calculated according to the following formula based on an X-ray diffraction profile. The $SmAlO_3$ phase content is preferably 1 percent or lower, and more preferably, 0.5 percent or lower:

the $SmAlO_3$ phase content=(integrated strength of the strongest peak of the $SmAlO_3$ phase/integrated strength of the strongest peak of the aluminum nitride phase)×100 percent.

The aluminum nitride ceramic according to the present embodiment has a low content of samarium and an intergranular phase substantially composed of the conductive material as described above. The aluminum nitride ceramic thus has a high purity and low volume resistivity.

In a preferred embodiment, the molar ratio of the converted content of samarium, calculated as samarium oxide, to the calculated content of aluminum oxide ($Sm_2O_3/Al_2O_3$) of the aluminum nitride ceramic is in a range of 0.01 to 0.05. It is possible to further reduce the possibility of contamination of semiconductors by reducing the molar ratio of the converted content of samarium, calculated as samarium oxide, to the calculated content of aluminum oxide ($Sm_2O_3/Al_2O_3$). The molar ratio of the converted content of samarium, calculated as samarium oxide, to the calculated content of aluminum oxide ($Sm_2O_3/Al_2O_3$) is more preferably 0.048 or lower.

The content of samarium in the aluminum nitride ceramic is analyzed and converted to a content of $Sm_2O_3$. The content of $Al_2O_3$ may be calculated by the following steps. First, total content of oxygen atoms in the sintered body is obtained. Second, the content of oxygen in $Sm_2O_3$ is subtracted from the total content of oxygen to obtain the content of remaining oxygen. The content of $Al_2O_3$ is calculated under the provision that all the remaining oxygen atoms are bonded with Al atoms to form $Al_2O_3$ molecules.

A second rare earth metal element, other than samarium, may be added into the aluminum nitride ceramic of the present invention. It is considered that the second rare earth element is solid soluted into the samarium-aluminum composite oxide phase. However, a composite oxide phase of the second rare earth element and aluminum, for example an Re$_3$Al$_5$O$_{12}$ phase (Re represents the second rare earth element), may be generated, depending on the formulation.

The second rare earth element, other than samarium, includes the following sixteen elements: scandium, yttrium, lanthanum, cerium, praseodymium, neodymium, promethium, europium, gadolinium, terbium, dysprosium, holmium, erbium, thulium, ytterbium and lutetium.

The aluminum nitride grains in the ceramic preferably have a mean diameter of at least 5 μm, and more preferably, at least 6 μm, from the viewpoint of the present invention. The upper limit of the mean particle diameter of the aluminum nitride grains is not particularly limited, and can be, for example, 20 μm.

The aluminum nitride raw material may be produced by various processes, including direct reduction, reduction nitriding and gaseous phase synthesis from an alkyl aluminum.

Samarium oxide may be added to the aluminum nitride raw material. Alternatively, a compound forming samarium oxide upon heating a samarium oxide precursor may be added to the aluminum nitride raw material. The precursor includes samarium nitrate, samarium sulfate and samarium oxalate. The precursor may be added as powder. Alternatively, a compound such as samarium nitrate or samarium sulfate may be dissolved into a solvent to obtain solution, which is then added to the aluminum nitride raw material. It is possible to uniformly disperse samarium atoms between aluminum nitride particles, by dissolving the precursor of samarium oxide into a solvent.

The raw material may be shaped by any known method including dry press, doctor blade, extrusion, casting and tape forming methods.

When the second rare earth element is added, the oxide of the second rare earth element may be added to the raw material of aluminum nitride. Alternatively, a compound of the rare earth element, including a nitrate, sulfate and alkoxide thereof, may be dissolved into a solvent which may dissolve the compound. The thus obtained solution may be added to the aluminum nitride raw material. It is thereby possible to uniformly disperse atoms of the second rare earth element in each region of the ceramic, even when a very low amount of the rare earth element is added.

In a formulating step, the aluminum nitride raw powder may be dispersed in a solvent, into which the rare earth element may be added in powder form or the solution described above. In a mixing step, it is possible to simply agitate the formulation. When the raw powder contains aggregates, it is possible to use a mixing and grinding machine, such as a pot mill, trommel and attrition mill, for grinding the aggregates. When using an additive that is soluble in a grinding solvent, it is enough to carry out the mixing and grinding step for a short (minimum) time required for the grinding the particles. Further, a binder component, such as polyvinyl alcohol, may be added.

The solvent used for the mixing step may be dried, preferably by a spray dry method. After carrying out vacuum drying process, the particle distribution of the dried particles is preferably adjusted by passing the particles through a mesh.

In a step of shaping the powdery material, the material may be pressed using a mold to provide a disk-shaped body. The pressure for pressing the raw material is not particularly limited, as long as the shaped body can be handled without causing any fracture. The pressure is preferably not lower than 100 kgf/cm$^2$. The powdery material may be supplied into a die for hot pressing without particularly shaping the powdery material.

In a preferred embodiment of the present invention, the inventive ceramic may be produced as follows. That is, a mixed powder containing at least 0.3 wt % of aluminum nitride raw material, 0.5 weight percent or less of Sm$_2$O$_3$, and at least 0.9 weight percent of Al$_2$O$_3$ is shaped to obtain a shaped body. The shaped body is then heated to a maximum temperature of at least 1850° C. for a time in a range of 1 minute to 4 hours. The temperature is raised at a rate in the range of 50° C./hour to 1000° C./hour (preferably 300° C. or lower) at least in a temperature range of 1600° C. or higher.

The ceramic according to the present invention is preferably produced by hot pressing the body to be sintered, preferably at a pressure of not lower than 50 kgf/cm$^2$.

The maximum temperature during the sintering step is preferably 1850° C. or higher, and more preferably, 1900° C. or higher, from the viewpoint of the present invention. The upper limit of the maximum temperature is not particularly defined, and may be 2200° C. for example.

The holding time at the maximum sintering temperature during the sintering step is 1 minute or longer. The holding time is preferably 0.5 hour or longer, and more preferably, 2 hours or longer, for facilitating the formation of the conductive phase.

The cooling rate after the maximum temperature is preferably at least 150° C./hr, more preferably, at least 450° C./hr, and most preferably, 700° C./hr. The reasons are as follows. As the cooling rate is larger, the residual potential remaining on the surface after a wafer that is removed, for an electrostatic chuck made of the inventive ceramics, is smaller, and its rate of reduction is also high.

For example, an electrostatic chuck was produced using a substrate made of the inventive ceramic produced using a cooling rate of 150° C./hr. A voltage of 500 volts was then applied on the chuck to adsorb a silicon wafer, which was then removed. The surface potential measured 3 minutes after removing the wafer was 49 volts, and it took 50 seconds to reach a surface potential of 0 volts. When the inventive ceramic produced using a cooling rate of 700° C./hr was used, the surface potential measured 3 minutes after removing the wafer was 42 volts, and it took 20 seconds to reach a surface potential of 0 volts. Further, the microstructure of the ceramic was observed. It was thus proved that the ceramic obtained using a cooling rate of 150° C./hr includes regions having large and small amounts of the intergranular phase and the regions are unevenly dispersed. To the contrary, the ceramic obtained using a cooling rate of 700° C./hr had an intergranular phase that was uniformly distributed over the entire ceramic microstructure. It is considered that such a uniform distribution of the intergranular phase affects the rapid disappearance of the residual potential on the surface. Also, in the ceramic obtained using a cooling rate of 450° C./hr, the intergranular phase proved to be uniformly distributed over the entire ceramic microstructure.

The aluminum nitride ceramic of the present invention is preferably used for various members in a semiconductor producing system, such as systems for treating silicon wafers and systems for manufacturing liquid crystal displays.

A system means a system that can be applied in a wide variety of semiconductor processes in which metal contamination (of the semiconductor to be produced) is to be avoided. Such systems include film forming, etching, cleaning and testing systems. The member for producing semiconductors using the ceramic according to the present invention means various members used for producing semiconductors, including a susceptor, ring, dome or the like. A resistance heating element, an electrode for an electrostatic chuck and an electrode for generating high-frequency wave may be embedded in the susceptor.

Further, the ceramic according to the present invention has a low resistivity and is preferably used as a substrate for an electrostatic chuck. A heat resistor, an electrode for generating plasma or the like may be embedded, in addition to an electrode for electrostatic chuck, in a substrate of the electrostatic chuck.

EXAMPLES

Aluminum nitride sintered bodies were produced as described below and the properties were evaluated.

(1) Production of mixed powder of aluminum nitride and samarium oxide

Commercial AlN raw powder produced by reduction nitriding was used. Commercial samarium oxide powder with a purity of at least 99.9 percent and a mean particle diameter of 1.1 µm was used.

Each powder was weighed as shown in Tables 1 and 4. Each weighed powder was then subjected to wet blending using isopropyl alcohol as a solvent, a nylon pot and nylon media for 4 hours to obtain slurry. After the blending, the slurry was collected and dried at 110° C. The thus dried powder was then subjected to heat treatment in an atmosphere at 450° C. for 5 hours to remove carbon content contaminated during the wet blending to produce a raw mixed powder. In the columns of "ratio (mole %)" of the mixed powder, the ratios of ALN powder and $Sm_2O_3$ powder were calculated ignoring the contents of impurities.

(2) Shaping and Sintering Steps

Each mixed powder obtained in (1) was then shaped by uniaxial pressing at a pressure of 200 kgf/cm² to obtain a disk-shaped body with a diameter of 100 mm or 50 mm and a thickness of 20 mm, which was then contained within a graphite mold for sintering.

Each shaped body was sintered by hot pressing at a pressure of 200 kgf/cm². During the sintering, the shaped body was set in a vacuum from room temperature to 1000° C. (1550° C. in some cases), and then nitrogen gas was introduced at a pressure of 1.5 kgf/cm² from 1000° C. (or 1550 C.) to each sintering (maximum) temperature. The maximum temperature was varied as shown in Tables 1 and 3. The holding time at each maximum temperature was 1 minute to 4 hours.

(3) Evaluation

The thus obtained sintered bodies were processed and then subjected to the following evaluations.

(Content of $Sm_2O_3$)

The content of Sm is determined by inductively coupled plasma (ICP) spectrometry and then converted to the content of $Sm_2O_3$.

(Content of $Al_2O_3$)

The total content of oxygen in the sintered body is obtained. The oxygen content in $Sm_2O_3$ is then subtracted from the total content of oxygen to calculate the remaining oxygen. The content of $Al_2O_3$ is calculated under the provision that all the remaining oxygen atoms constitute $Al_2O_3$.

(Molar ratio: $Sm_2O_3/Al_2O_3$)

The $Sm_2O_{3/Al2O3}$ ratio is calculated from the contents of $Sm_2O_3$ and $Al_2O_3$ obtained above.

(Oxygen content)

The oxygen content is determined by inert gas melting infrared absorptiometry analysis method.

(Content of TiN)

The Ti content is determined by ICP spectrometry and then converted to the content of TiN.

(Content of MgO)

The Mg content is determined by ICP spectrometry and then converted to the content of MgO.

(Density, Open Porosity)

The density and open porosity are measured by Archimedes method using water as a medium.

(Composition of Sintered Body)

The contents of $Sm_2O_3$, $Al_2O_3$, TiN and MgO, calculated as described above, are subtracted from 100 mole percent to provide the content of AlN. This calculation is performed under the provision that total of the contents of AlN, $Sm_2O_3$, $Al_2O_3$, TiN and MgO is 100 mole percent.

(Volume Resistivity)

Volume resistivity is measured by a method according to "JIS C 2141" from room temperature to about 400° C. under a vacuum. The test sample has the following parts: a plate with d 50 mm×1 mm or 50 mm×50 mm×1 mm; a main electrode with a diameter of 20 mm; a guard electrode with an inner diameter of 30 mm and outer diameter of 40 mm; and an applying electrode with a diameter of 40 mm. The electrodes are formed of silver. 500 V/mm of voltage is applied and a current is read one minute after the application of voltage so that the volume resistivity is calculated.

(Thermal Conductivity)

The thermal conductivity is measured by laser flash method.

(Mean Grain Diameter of AlN Grains)

The sintered body is polished to form a polished surface, which is observed by an electron microscope to determine grain diameter values at 30 points in a visual field. The average of the 30 values is calculated.

(Crystalline Phase)

The crystalline phase is determined by using a rotating anode type X-ray diffraction system "RINT" supplied by "Rigaku Denki" under the following conditions: CuK α, 50 kV, 300 mA, and 2 θ=10 to 70°.

(Identification and Measurement of Peak Strength of $SmAl_{11}O_{18}$ Phase)

One peak (2 θ=18.8°) of $SmAl_{11}O_{18}$ phase not overlapping with the other crystalline peaks, (110) peak of $SmAlO_3$ phase, and the (200) peak of AlN phase are subjected to profile fitting by means of a Pseudo-Voigt function to obtain the integrated strengths of the peaks. Since the strongest peaks of $SmAl_{11}O_{18}$, $SmAlO_3$ and AlN phases overlap the other peaks, each integrated strength of each strongest peak is calculated as follows.

The integrated strength of the strongest peak of $SmAlO_3$ phase is calculated based on the ratio of the strengths of the strongest peak (112) and the above reference peak (110) referring to JCPDS cards. The integrated strength of the strongest peak of AlN phase is calculated based on the ratio of the strengths of the strongest peak (100) and the above reference peak (200) referring to JCPDS cards.

Although the presence of the $SmAl_{11}O_{18}$ phase is confirmed in a phase diagram, the corresponding JCPDS card is not presented. $SmnAl_{11}O_{18}$ is produced from $Sm_2O_3$ and $Al_2O_3$ and the peak profile is measured using an X-ray diffraction system. The strength of the strongest peak of the $SmAl_{11}O_{18}$ phase (2 θ=about 34°) and that of a reference peak (2 θ=18.8°) are calculated. The ratio of the strengths was used to calculate the strength of the strongest peak in each AlN sintered body.

Further, in each of the sintered bodies, the contents of $SmAl_{11}O_{18}$ and $SmAlO_3$ phases are low, so that they are not detectable by means of an X ray diffraction analysis under the same measuring condition as the AlN phase. The counting time for counting X-ray was made 10 times longer than that for measuring the AlN phase. In other words, the counting time for the AlN phase was 1/10 of that for measuring the $SmAl_{11}O_{18}$ and $SmAlO_3$ phases. The measured strength of the AlN phase was thus multiplied by 10 times (it was shown as "converted amount" in the Tables).

(Length of samarium-aluminum composite oxide phase)

A software "ImageProPlus (Ver4.5)" supplied by Pranetron Inc. is used to determine the length of the samarium-aluminum composite oxide phase. Each command name in the software in the following procedure is specified using a parenthesis.

(1) An image file of the cross section of AlN is obtained at a magnitude of 3000. An area of 40×25 μm or more is obtained in a resolution of □ 0.56 μm/1 pixel as a gray scale image.

(2) A portion (712×465 pixels) is cut out from the measured area and then subjected to "5×5 gauss" filter twice to remove small noises.

(3) A small region of □ 75 to 100 pixels considered to be AlN was cut out and "histogram is shown" on the grayscale value to obtain the average and standard deviation.

(4) When an extremely bright region which is not counted as the intergranular phase is observed, "histogram is shown" to confirm the distribution on grayscale. (5) The image was then subjected to "binarization" based on upper and lower values. The upper value is set at the average value in (3)+10 ($0.5 \leq \alpha < 1.0$), 20 ($1.0 \leq \alpha < 1.5$), or 30 ($1.5 \leq \alpha < 2.0$), and the upper value is set at the lowest of the distribution in (4).

(6) The white portions in the binarized image obtained in (5) is assigned as the intergranular phase. The center line is extracted from the binarized image using "thinning" filter.

(7) The thus extracted center lines are subjected to "count/size" processing to measure "length of branch" of the center line. The length of branch is defined as the "length of center line." When the center line has a plurality of branched/merged portions, the image was subjected to a "branch/end point" filter to extract only the "branches" and "end points." At each branched portion, longer branches are selected so that the "length of branch" is made as long as possible. The thus obtained total length of the branch is applied as the length of center line. When the center line is ring or loop shaped, the circumferential length of the loop is measured to obtain the length of center line. The outline of the region extracted in (4) was removed from the object for counting using "remove the object" command.

(8) The maximum of the obtained lengths of center lines is selected and multiplied with a resolution per one pixel (0.57 μm/pixel) to obtain the length of intergranular phase of the object for evaluation.

(Lattice Parameter)

An XRD profile was obtained using an X-ray diffraction system, and then processed using WPPF (Whole-Powder-Pattern Fitting) program to calculate the lattice parameter.

Specifically, the sintered bodies according to the above examples are ground to obtain powder, which is then mixed with $Al_2O_3$ powder having a known lattice constant as an internal standard in a ratio of 1:1 to obtain mixed powder. CuK β ray is removed by means of a monochrometer from CuK α ray, which is then irradiated onto each sample (mixed powder) to measure the profile. The measurement is carried out the following condition: 50 kV, 300 mA, and 2 θ=30 to 120°, a rotating anode type X-ray diffraction system "RINT-2000 series" supplied by "Rigaku Denki."

Further, a program "WPPF" attached as an option was used to carry our profile fitting to obtain a lattice parameter. It is possible to carry out a precise calculation based on the lattice parameter of an internal standard and an approximation of the lattice parameter of AlN by means of the "WPPF" program.

Specifically, "WPPF" is activated and an area for fitting (2 θ) is specified from the measured profile. Thereafter, semi-automatic fitting is carried out first and then manual fitting is followed. The approximation in the manual fitting process is performed as follows. The background strength, peak strength, lattice parameter, half value width, asymmetrical parameter of the peak, damping factor of the strength of profile on the side of lower angle, and damping factor of the strength of profile on the side of higher angle are subjected to the precise calculation for each parameter. "Fixed" or "Valuable" is selected before each of the precise calculations. The precise calculation is performed until the calculated profile and measured profile are made identical with each other (Rwp (standard deviation)=0.1 or lower). A reliable lattice parameter can be obtained by means of the precise calculation.

The "WPPF" is described in detail in H. Toraya, "Whole-Powder-Pattern Fitting Without Reference to a Structural Model: Application to X-ray Powder Diffractometer Data," J. Appl. Cryst. 19, 440–447.

TABLE 1

| | raw powder | | sintering condition | | | | chemical anaysis data | | | | |
|---|---|---|---|---|---|---|---|---|---|---|---|
| | AlN powder | | | temperature | | temperature | | | | | |
| | oxygen content wt % | Sm2O3 mol % | maximum temperature ° C. | ascending rate ° C./hr | holding time hr | descending rate ° C./hr | Sm content wt % | O content wt % | Ti content wt % | Mg content wt % | C content wt % |
| example 1 | 0.87 | 0.035 | 1900 | 1000 | 4 | 300 | 0.23 | 1.11 | 0.00 | 0.00 | 0.027 |
| example 2 | 0.87 | 0.035 | 1900 | 1000 | 4 | 300 | 0.23 | 1.15 | 0.03 | 0.00 | 0.026 |
| example 3 | 0.87 | 0.035 | 1900 | 1000 | 4 | 300 | 0.23 | 1.12 | 0.00 | 0.00 | 0.026 |
| example 4 | 0.87 | 0.035 | 2000 | 1000 | 4 | 300 | 0.24 | 1.00 | 0.00 | 0.00 | 0.027 |
| example 5 | 0.87 | 0.035 | 2000 | 1000 | 4 | 300 | 0.23 | 1.11 | 0.03 | 0.00 | 0.028 |
| example 6 | 0.87 | 0.035 | 2000 | 1000 | 4 | 300 | 0.26 | 1.08 | 0.00 | 0.00 | 0.027 |
| example 7 | 0.87 | 0.046 | 1850 | 50 | 2 | 150 | 0.35 | 1.40 | 0.00 | 0.05 | 0.031 |
| example 8 | 0.87 | 0.046 | 1850 | 50 | 2 | 150 | 0.36 | 1.30 | 0.13 | 0.02 | 0.038 |
| example 9 | 0.87 | 0.046 | 1900 | 1000 | 4 | 300 | 0.32 | 1.37 | 0.13 | 0.00 | 0.039 |

TABLE 1-continued

| | raw powder | | sintering condition | | | | chemical anaysis data | | | | |
|---|---|---|---|---|---|---|---|---|---|---|---|
| | AlN powder | | | temperature | | temperature | | | | | |
| | oxygen content wt % | Sm2O3 mol % | maximum temperature ° C. | ascending rate ° C./hr | holding time hr | descending rate ° C./hr | Sm content wt % | O content wt % | Ti content wt % | Mg content wt % | C content wt % |
| example 10 | 0.87 | 0.046 | 1900 | 1000 | 4 | 300 | 0.34 | 1.39 | 0.00 | 0.02 | 0.032 |
| example 11 | 0.87 | 0.046 | 1900 | 1000 | 4 | 300 | 0.35 | 1.26 | 0.13 | 0.02 | 0.038 |
| example 12 | 0.87 | 0.059 | 1900 | 1000 | 4 | 300 | 0.39 | 1.37 | 0.00 | 0.00 | 0.029 |

TABLE 2

| | Sm2O3 converted content mol % | Al2O3 converted content mol % | Sm2O3/ Al2O3 mol π | TiN converted content mol % | MgO converted content mol % | length of intergranular phase mm | open porosity % |
|---|---|---|---|---|---|---|---|
| example 1 | 0.032 | 0.931 | 0.034 | 0.00 | 0.00 | 23 | 0.01 |
| example 2 | 0.032 | 0.967 | 0.033 | 0.02 | 0.00 | 19 | 0.02 |
| example 3 | 0.032 | 0.940 | 0.034 | 0.00 | 0.00 | 27 | 0.01 |
| example 4 | 0.029 | 0.837 | 0.035 | 0.00 | 0.00 | 17 | 0.01 |
| example 5 | 0.028 | 0.935 | 0.030 | 0.02 | 0.00 | 11 | 0.01 |
| example 6 | 0.030 | 0.906 | 0.034 | 0.00 | 0.00 | 20 | 0.02 |
| example 7 | 0.049 | 1.146 | 0.043 | 0.00 | 0.02 | 25 | 0.01 |
| example 8 | 0.050 | 1.120 | 0.045 | 0.09 | 0.02 | 31 | 0.00 |
| example 9 | 0.045 | 1.149 | 0.039 | 0.09 | 0.00 | 13 | 0.00 |
| example 10 | 0.047 | 1.146 | 0.041 | 0.00 | 0.02 | 12 | 0.00 |
| example 11 | 0.049 | 1.042 | 0.047 | 0.09 | 0.02 | 30 | 0.02 |
| example 12 | 0.054 | 1.140 | 0.048 | 0.00 | 0.00 | 18 | 0.02 |

| | bulk density g/cm3 | volume resistivity Ω · cm | Thermal conductivity W/mK | mean grain diameter of AlN μm | crystal linephases (other than AlN phases) |
|---|---|---|---|---|---|
| example 1 | 3.26 | 3.1E+11 | 81 | 6 | SmAl11O18, Al5O6N |
| example 2 | 3.26 | 2.8E+11 | 80 | 5 | SmAl11O18, Al5O6N |
| example 3 | 3.26 | 2.9E+11 | 81 | 6 | SmAl11O18, Al5O6N |
| example 4 | 3.27 | 7.2E+10 | 74 | 10 | SmAl11O18, SmAlO3, Al5O6N |
| example 5 | 3.26 | 1.0E+11 | 75 | 10 | same as above |
| example 6 | 3.25 | 6.1E+10 | 75 | 11 | same as above |
| example 7 | 3.27 | 9.4E+10 | 81 | 5 | same as above |
| example 8 | 3.27 | 1.6E+11 | 80 | 5 | same as above |
| example 9 | 3.27 | 1.3E+11 | 78 | 5 | SmAl11O18, Al5O6N |
| example 10 | 3.27 | 1.6E+11 | 78 | 5 | SmAl11O18, SmAlO3, Al5O6N |
| example 11 | 3.27 | 8.9E+10 | 77 | 5 | same as above |
| example 12 | 3.27 | 9.9E+10 | 81 | 5 | SmAl11O18, Al5O6N |

TABLE 3

| | XRD | | | | | | | | |
|---|---|---|---|---|---|---|---|---|---|
| | SmAl11O18 | | | | AlN | | SmAlO3/ AlN (%) | lattice parameter | |
| | 2 θ = 18.8° | the strongest peak | SmAlO3 (110) | (112) | (200) | (100) | converted amount* | (112)/ (100) | a( Å) | c( Å) |
| example 1 | 567.5 | 2101.9 | 0.0 | 0.0 | 1299.0 | 25980.5 | 259805.4 | 0.0 | 3.11145 | 4.97909 |
| example 2 | 553.3 | 2049.4 | 0.0 | 0.0 | 1330.3 | 26606.3 | 266063.4 | 0.0 | 3.11138 | 4.97922 |
| example 3 | 580.2 | 2148.9 | 0.0 | 0.0 | 1364.7 | 27293.3 | 272933.4 | 0.0 | 3.11149 | 4.97893 |
| example 4 | 257.5 | 953.7 | 398.7 | 643.0 | 1356.2 | 27123.9 | 271239.0 | 0.2 | 3.11140 | 4.97911 |
| example 5 | 394.8 | 1462.2 | 119.1 | 192.1 | 1374.0 | 27480.9 | 274809.4 | 0.1 | 3.11141 | 4.97913 |
| example 6 | 515.9 | 1910.7 | 166.9 | 269.2 | 1354.2 | 27084.1 | 270841.0 | 0.1 | 3.11135 | 4.97918 |
| example 7 | 725.8 | 2688.1 | 385.4 | 621.6 | 1356.6 | 27132.1 | 271321.0 | 0.2 | 3.11149 | 4.97939 |
| example 8 | 750.4 | 2779.3 | 498.8 | 804.4 | 1387.6 | 27752.1 | 277521.0 | 0.3 | — | — |
| example 9 | 808.7 | 2995.0 | 0.0 | 0.0 | 1351.9 | 27038.8 | 270388.2 | 0.0 | 3.11148 | 4.97892 |

TABLE 3-continued

| | XRD | | | | | | | | |
|---|---|---|---|---|---|---|---|---|---|
| | SmAl11O18 | | | | AlN | SmAlO3/ AlN (%) | | lattice parameter | |
| | 2θ = 18.8° | the strongest peak | SmAlO3 (110) | SmAlO3 (112) | AlN (200) | AlN (100) | converted amount* | (112)/ (100) | a(Å) | c(Å) |
| example 10 | 695.7 | 2576.5 | 405.3 | 653.8 | 1378.9 | 27578.8 | 275788.2 | 0.2 | 3.11151 | 4.97912 |
| example 11 | 720.2 | 2667.5 | 533.6 | 860.6 | 1287.0 | 25740.8 | 257408.0 | 0.3 | 3.11141 | 4.97922 |
| example 12 | 1225.2 | 4537.7 | 0.0 | 0.0 | 1308.6 | 26172.0 | 261720.0 | 0.0 | 3.11139 | 4.97877 |

TABLE 4

| | raw powder | | sintering condition | | | | chemical anaysis data | | | | |
|---|---|---|---|---|---|---|---|---|---|---|---|
| | AlN powder oxygen content wt % | Sm2O3 mol % | maximum temperature °C. | temperature ascending rate °C./hr | holding time hr | temperature descending rate °C./hr | Sm content wt % | O content wt % | Ti content wt % | Mg content wt % | C content wt % |
| example 13 | 0.87 | 0.046 | 1900 | 50 | 2 | 150 | 0.34 | 1.46 | 0.13 | 0.00 | 0.036 |
| example 14 | 0.87 | 0.046 | 1900 | 50 | 2 | 150 | 0.39 | 1.39 | 0.00 | 0.05 | 0.026 |
| example 15 | 0.87 | 0.046 | 1900 | 50 | 2 | 150 | 0.32 | 1.15 | 0.13 | 0.02 | 0.031 |
| example 16 | 0.87 | 0.059 | 1900 | 50 | 2 | 150 | 0.46 | 1.50 | 0.00 | 0.00 | 0.025 |
| example 17 | 0.87 | 0.046 | 1900 | 50 | 2 | 150 | 0.30 | 1.22 | 0.10 | 0.01 | 0.026 |
| example 18 | 0.87 | 0.046 | 1900 | 50 | 1 min. | 150 | 0.30 | 1.21 | 0.10 | 0.01 | 0.033 |
| example 19 | 0.87 | 0.046 | 1900 | 50 | 0.5 | 150 | 0.34 | 1.19 | 0.10 | 0.01 | 0.027 |
| example 20 | 0.87 | 0.046 | 1900 | 50 | 2 | 700 | 0.31 | 1.16 | 0.10 | 0.01 | 0.028 |
| example 21 | 0.87 | 0.046 | 1900 | 1000 | 4 | 350 | 0.28 | 1.15 | 0.10 | 0.01 | 0.033 |
| comparative example 1 | 0.97 | 0.020 | 1800 | 1000 | 4 | 300 | 0.16 | 0.80 | 0.00 | 0.00 | 0.031 |
| comparative example 2 | 0.87 | 0.230 | 1800 | 1000 | 4 | 300 | 1.43 | 1.06 | 0.00 | 0.00 | 0.030 |
| comparative example 3 | 0.87 | 0.120 | 1800 | 1000 | 4 | 300 | 0.70 | 0.85 | 0.00 | 0.00 | 0.030 |

TABLE 5

| | Sm2O3 converted content mol % | Al2O3 converted content mol % | Sm2O3/ Al2O3 mol π | TiN Converted content mol % | MgO converted content mol % | length of intergranular phase mm | open porosity % |
|---|---|---|---|---|---|---|---|
| example 13 | 0.040 | 1.233 | 0.033 | 0.09 | 0.00 | 37 | 0.04 |
| example 14 | 0.047 | 1.146 | 0.041 | 0.00 | 0.05 | 27 | 0.02 |
| example 15 | 0.039 | 0.955 | 0.041 | 0.09 | 0.02 | 28 | 0.02 |
| example 16 | 0.056 | 1.254 | 0.044 | 0.00 | 0.00 | 24 | 0.00 |
| example 17 | 0.042 | 1.014 | 0.041 | 0.09 | 0.01 | 32 | 0.01 |
| example 18 | 0.042 | 1.005 | 0.041 | 0.09 | 0.02 | 39 | 0.00 |
| example 19 | 0.047 | 0.983 | 0.048 | 0.09 | 0.01 | 37 | 0.00 |
| example 20 | 0.043 | 0.960 | 0.045 | 0.09 | 0.01 | 25 | 0.00 |
| example 21 | 0.039 | 0.955 | 0.041 | 0.09 | 0.02 | 27 | 0.01 |
| comparative example 1 | 0.022 | 0.669 | 0.033 | 0.00 | 0.00 | 4 | 0.04 |
| comparative example 2 | 0.200 | 0.729 | 0.274 | 0.00 | 0.00 | 14 | 0.02 |
| comparative example 3 | 0.097 | 0.641 | 0.151 | 0.00 | 0.00 | 12 | 0.04 |

| | bulk density g/cm3 | volume resistivity Ω·cm | Thermal conductivity W/mK | mean grain diameter of AlN μm | crystal linephases (other than AlN phases) |
|---|---|---|---|---|---|
| example 13 | 3.27 | 5.3E+10 | 83 | 6 | SmAl11O18, SmAlO3 Al5O6N |
| example 14 | 3.27 | 6.9E+10 | 82 | 6 | same as above |
| example 15 | 3.27 | 6.6E+10 | 80 | 5 | same as above |
| example 16 | 3.27 | 4.4E+10 | 83 | 6 | same as above |

TABLE 5-continued

| | | | | | |
|---|---|---|---|---|---|
| example 17 | 3.26 | 5.0E+10 | 79 | 6 | same as above |
| example 18 | 3.26 | 6.8E+10 | 80 | 5 | same as above |
| example 19 | 3.28 | 5.8E+10 | 79 | 5 | same as above |
| example 20 | 3.27 | 8.1E+10 | 79 | 5 | SmAl11O18, Al5O6N |
| example 21 | 3.27 | 2.2E+11 | 75 | 5 | SmAl11O18, SmAlO3 Al5O6N |
| comparative example 1 | 3.26 | 4.0E+15 | 96 | 4 | SmAl11O18 |
| comparative example 2 | 3.30 | 3.0E+11 | 105 | 4 | SmAl11O18, SmAlO3 |
| comparative example 3 | 3.28 | 2.0E+11 | 98 | 4 | same as above |

TABLE 6

| | XRD | | | | | | | | |
|---|---|---|---|---|---|---|---|---|---|
| | SmAl11O18 | | | | AlN | | SmAlO3/ AlN (%) | lattice parameter | |
| | the | | SmAlO3 | | | converted | | | |
| | $2\theta =$ strongest | | | | | | | | |
| | 18.8° | peak | (110) | (112) | (200) | (100) | amount* | (112)/ (100) | a(Å) c(Å) |
| example 13 | 678.3 | 2512.3 | 184.6 | 297.7 | 1282.9 | 25657.8 | 256578.4 | 0.1 | 3.11149 4.97912 |
| example 14 | 747.3 | 2767.6 | 238.4 | 384.5 | 1296.5 | 25930.4 | 259304.2 | 0.1 | 3.11145 4.97929 |
| example 15 | 690.4 | 2557.0 | 244.9 | 395.0 | 1288.7 | 25774.0 | 257740.0 | 0.2 | 3.11142 4.97930 |
| example 16 | 1000.8 | 3706.6 | 227.7 | 367.3 | 1287.1 | 25741.4 | 257413.6 | 0.1 | 3.11149 4.97929 |
| example 17 | 902.2 | 3341.6 | 302.2 | 487.5 | 1353.2 | 27063.1 | 270631.4 | 0.2 | 3.11147 4.97970 |
| example 18 | 753.2 | 2789.7 | 209.1 | 337.2 | 1328.8 | 26575.9 | 265759.4 | 0.1 | 3.11148 4.97942 |
| example 19 | 665.9 | 2466.2 | 313.3 | 505.3 | 1226.8 | 24536.6 | 245366.2 | 0.2 | 3.11146 4.97945 |
| example 20 | 899.9 | 3332.9 | 0.0 | 0.0 | 1232.1 | 24641.8 | 246417.8 | 0.0 | 3.11150 4.97951 |
| example 21 | 714.9 | 2647.9 | 501.9 | 809.5 | 1456.9 | 29138.5 | 291384.6 | 0.3 | 3.11148 4.97905 |
| comparative example 1 | 553.4 | 2049.6 | 0.0 | 0.0 | 1328.1 | 26562.0 | 265620.0 | 0.0 | 3.11161 4.97920 |
| comparative example 2 | 234.1 | 867.0 | 8249.5 | 13305.6 | 1298.5 | 25970.0 | 259700.0 | 5.1 | 3.11162 4.97938 |
| comparative example 3 | 258.5 | 957.5 | 4334.6 | 6991.4 | 1238.3 | 24765.4 | 247654.0 | 2.8 | 3.11164 4.97965 |

The results of the evaluations will be described for each example.

(Example 1: Tables 1, 2 and 3)

The AlN raw powder with 0.035 mole percent of added $Sm_2O_3$ was sintered at 1900° C. to provide a dense body with a density of 3.26 g/cm³ and an open porosity of 0.01 percent. nitride particles was 6 μm, and SmAlO₃/AlN (ratio of peak strengths) was 0.0 percent. The volume resistivity was $3.1\times10^{11}$ Ω·cm at room temperature (25° C). In Table 2, "3.1 The converted content of $Sm_2O_3$ was 0.032 mole percent. A ratio of the converted content of Sm calculated as $Sm_2O_3$ to a calculated content of aluminum oxide ($Sm_2O_3/Al_2O_3$) (molar ratio) was 0.034. The mean grain diameter of aluminum$\times10^{11}$" was represented as "3.1E+11". The same method of representation is applied in the above tables.

Figure 2:
FIG. 2 is a photograph obtained by image processing the photograph of FIG. 1.

FIG. 1 is a photograph showing the microstructure of the sintered body according to Example 1 (taken at a magnitude of 3000). FIG. 2 is a photograph obtained by image processing of the photograph shown in FIG. 1. The blackish portions on the contrast were identified as aluminum nitride particles and the whitish portions were identified as the intergranular phase. The length of the intergranular phase proved to be 23 μm. The intergranular phase was substantially and three-dimensionally interconnected to form a network microstructure.

(Examples 2 to 10: Tables 1, 2 and 3)

In Example 2, the AlN raw powder with 0.035 mole percent of added $Sm_2O_3$ was sintered at 1900° C. to provide a dense body with a density of 3.26 g/cm³. The converted content of $Sm_2O_3$ was 0.032 mole percent. A molar ratio of the converted content of Sm calculated as $Sm_2O_3$ to a calculated content of aluminum oxide ($Sm_2O_3/Al_2O_3$) was 0.033. The mean grain diameter of aluminum nitride particles was 5 μm, and SmAlO₃/AlN (ratio of peak strengths) was 0.0 percent. The volume resistivity was $2.8\times10^{11}$ Ω·cm at room temperature (25° C.). The length of the intergranular phase proved to be 19 μm. The intergranular phase was substantially and three-dimensionally interconnected to form a network microstructure.

In Example 3, the AlN raw powder with 0.035 mole percent of added $Sm_2O_3$ was sintered at 1900° C. to provide a dense body with a density of 3.26 g/cm³. The converted content of $Sm_2O_3$ was 0.032 mole percent. A molar ratio of the converted content of Sm calculated as $Sm_2O_3$ to a calculated content of aluminum oxide ($Sm_2O_3/Al_2O_3$) was 0.034. The mean grain diameter of aluminum nitride particles was 6 μm, and SmAlO₃/AlN (ratio of peak strengths) was 0.0 percent. The volume resistivity was $2.9\times10^{11}$ Ω·cm at room temperature (25° C.). The length of the intergranular phase proved to be 27 μm. The intergranular phase were substantially and three-dimensionally interconnected to form a network microstructure.

Figure 11:
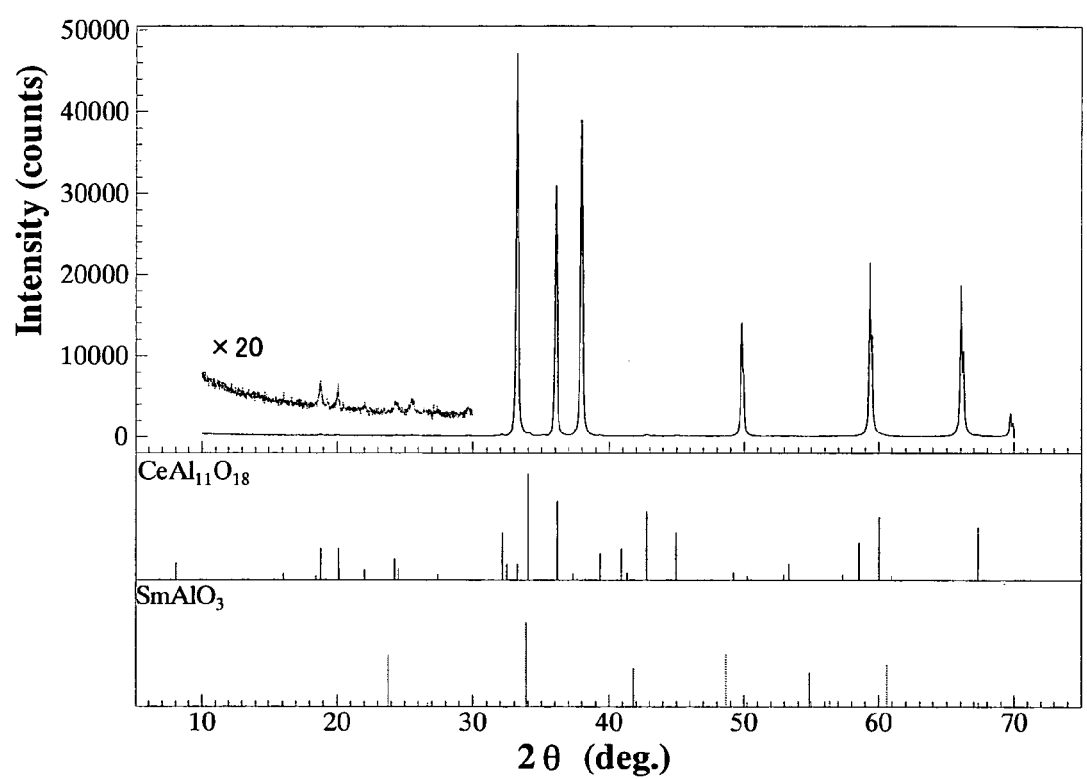
FIG. 11 is an X-ray diffraction profile of a sintered body according to Example 3.

FIG. 11 is an X-ray diffraction profile of the sintered body according to Example 3, in which a view, enlarged 20 times, of a range of 2 θ=10 to 30° is also shown. A peak of the SmAlO$_3$ phase is not identified and the intergranular phase is substantially composed of only SmAl$_{11}$O$_{18}$ phase. The JCPDS card corresponding to the SmAl$_{11}$O$_{18}$ phase is not present, and the JCPDS card of CeAl$_{11}$O$_{18}$ is used as a substitute to identify its peaks. That is, as shown in FIG. 11, peak positions corresponding to crystalline phases other than the AlN phase (JCPDS No. 25-1133) are substantially identical with those of the CeAl$_{11}$O$_{18}$ phase (JCPDS card No. 48-0055). The secondary phase was thus identified as SmnAl$_{11}$O$_{18}$ phase having the same crystalline structure as a CeAl$_{11}$O$_{18}$ phase. The presence of the SmAl$_{11}$O$_{18}$ phase is confirmed in a phase diagram of Sm$_2$O$_3$·Al$_2$O$_3$ system (Phase Diagrams for Ceramists, 1975 Supplement, Fig. 4369).

In Examples 4 to 12, the converted amount of Sm$_2$O$_3$ in the sintered body was 0.028 to 0.054 mole percent and the ratio of the converted content of Sm calculated as Sm$_2$O$_3$ to the converted content of aluminum oxide (Sm$_2$O$_3$/Al$_2$O$_3$) was 0.030 to 0.048. The mean grain diameter of aluminum nitride particles was 5 μm or more, and the SmAlO$_3$/AlN (ratio of peak strengths) was less than 0.3 percent. The volume resistivity was 1.6×10$^{11}$ Ω·cm or lower at room temperature (25° C.). The length of the intergranular phase proved to be 11 to 31 μm. The intergranular phase was substantially and three-dimensionally interconnected to form a network microstructure.

Figure 3:
FIG. 3 is a photograph (after the image processing) showing the microstructure of a sintered body according to Example 6.
Figure 4:
FIG. 4 is a photograph obtained by image processing the photograph of FIG. 3.
Figure 12:
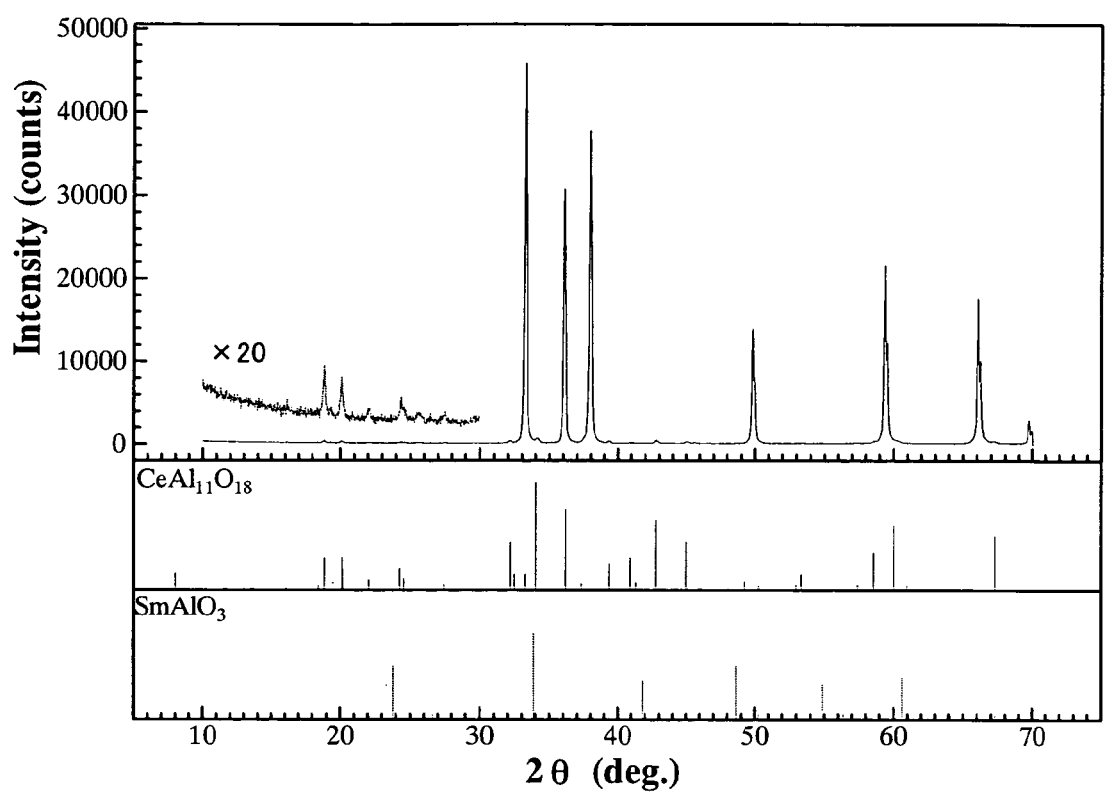
FIG. 12 is an X-ray diffraction profile of a sintered body according to Example 12.

FIG. 3 is a photograph showing the microstructure of the sintered body according to Example 6 (taken at a magnitude of 3000). FIG. 4 is a photograph obtained by image processing the photograph shown in FIG. 3. FIG. 12 is an X-ray diffraction profile of the sintered body according to Example 12, in which a view, enlarged 20 times, of a range of 2 θ=10 to 30° is also shown. A peak of the SmAlO$_3$ phase is not identified and the intergranular phase is substantially composed of only SmAl$_{11}$O$_{18}$ phase.

(Examples 13 to 21: Tables 4, 5 and 6)

Also in Examples 13 to 21, the converted amount of Sm$_2$O$_3$ in the sintered body was 0.039 to 0.056 mole percent and the ratio of the converted content of Sm calculated as Sm$_2$O$_3$ to a converted content of aluminum oxide (Sm$_2$O$_3$/Al$_2$O$_3$) (molar ratio) was 0.033 to 0.048. The mean grain diameter of aluminum nitride particles was 5 or 6 μm, and the SmAlO$_3$/AlN (ratio of peak strengths) was 0.2 percent or lower. The volume resistivity was 6.9×10$^{10}$ Ω·cm or lower at room temperature (25° C.). The length of the intergranular phase proved to be 24 to 37 μm. The intergranular phase were substantially and three-dimensionally interconnected to form a network microstructure.

Figure 5:
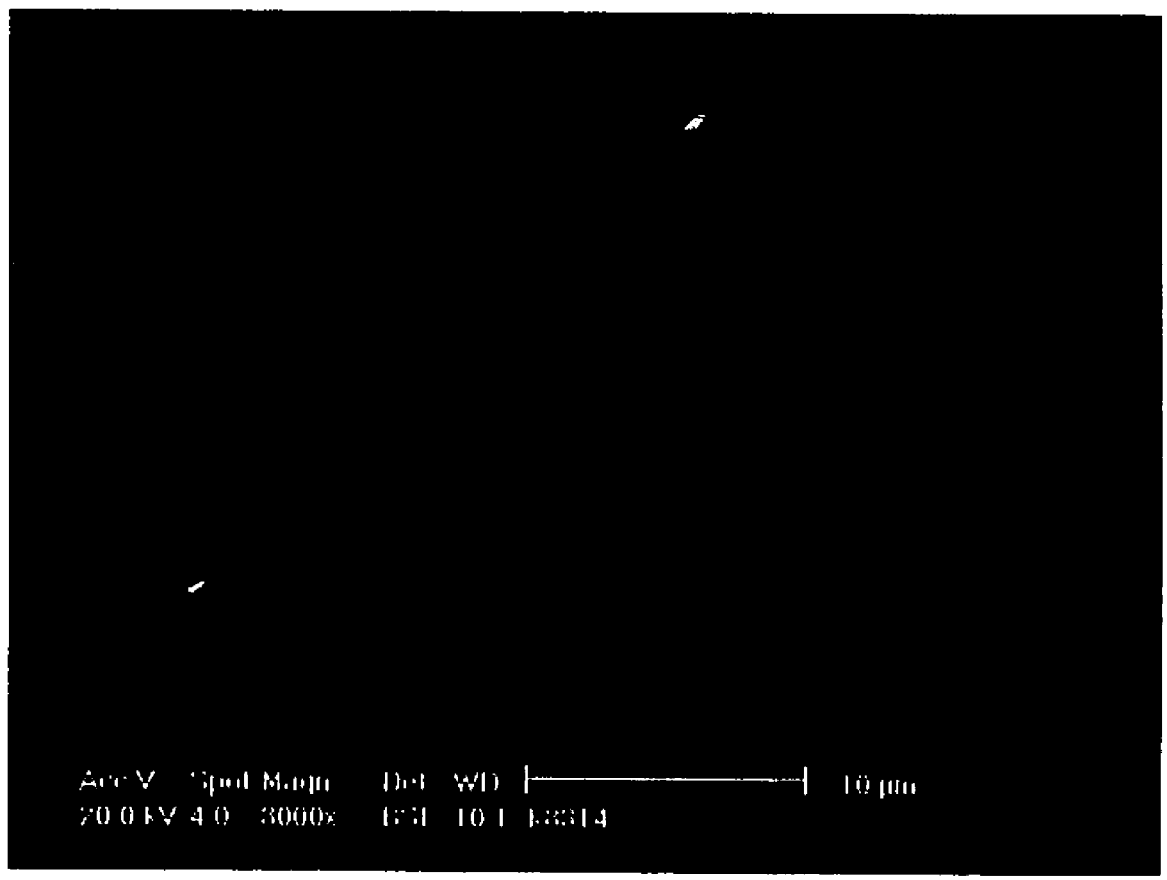
FIG. 5 is a photograph (after image processing) showing the microstructure of a sintered body according to Example 13.
Figure 6:
FIG. 6 is a photograph obtained by image processing the photograph of FIG. 5.
Figure 7:
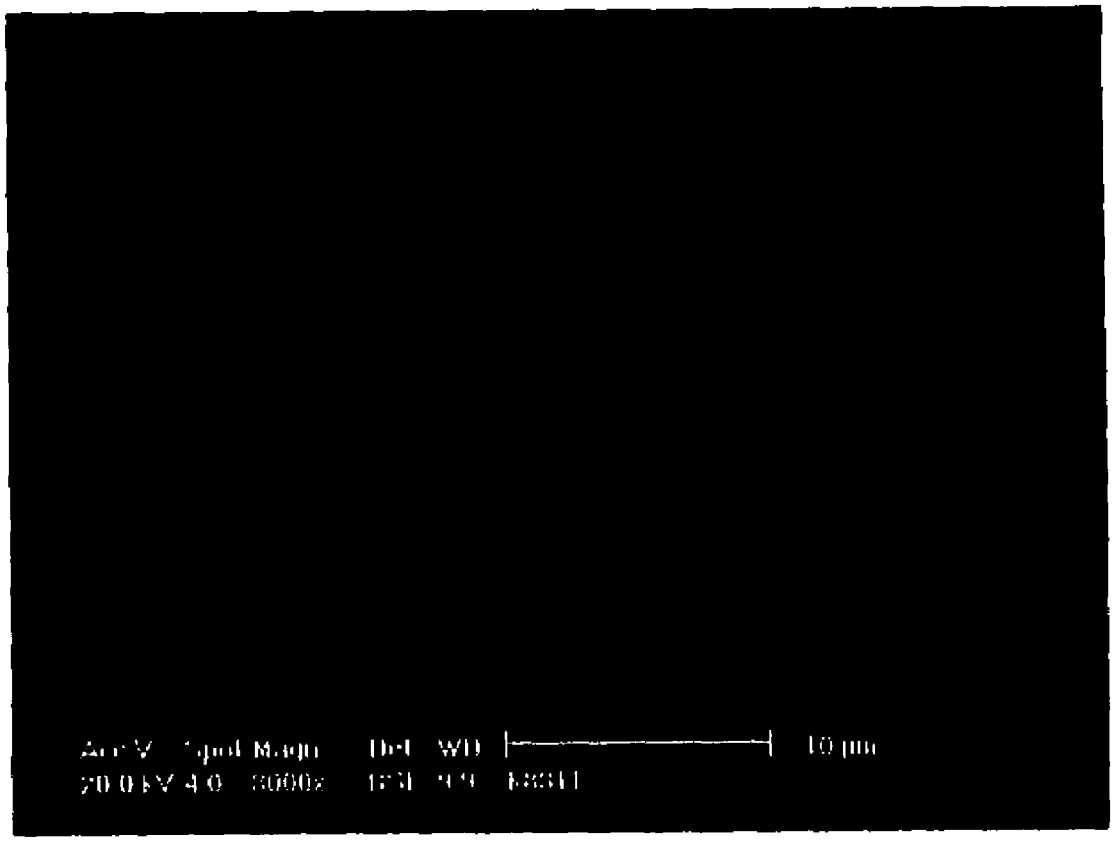
FIG. 7 is a photograph (after image processing) showing the microstructure of a sintered body according to Example 16.
Figure 8:
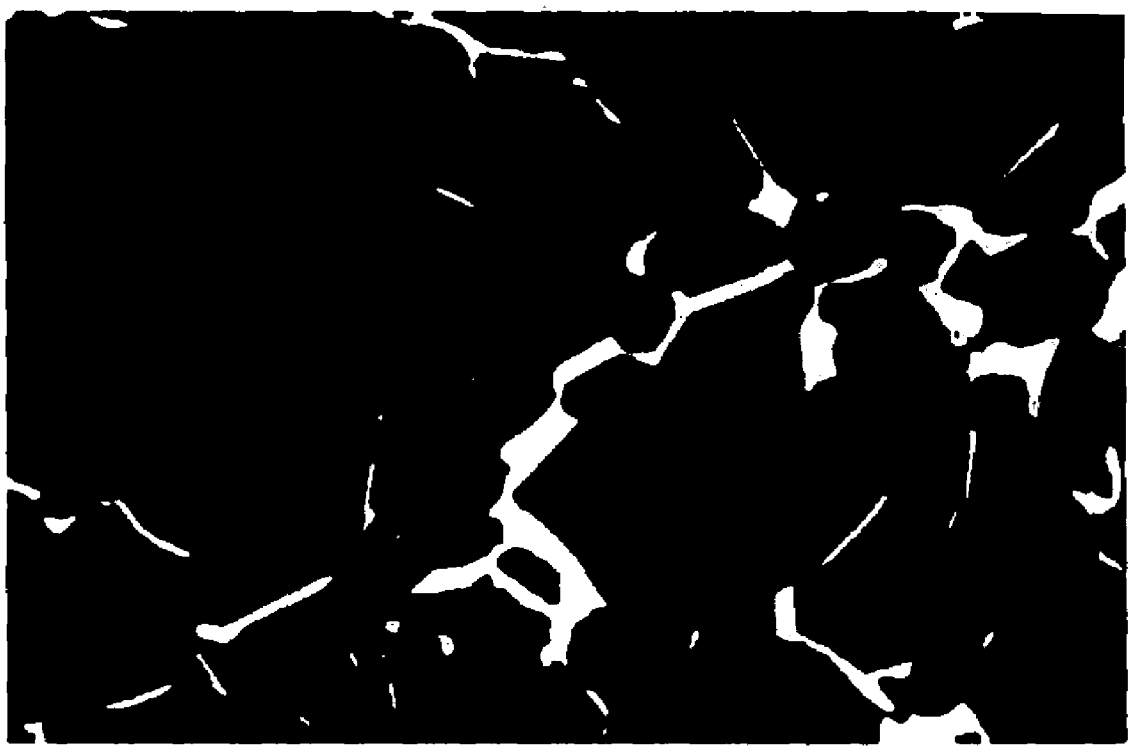
FIG. 8 is a photograph obtained by image processing the photograph of FIG. 7.

FIG. 5 is a photograph showing the microstructure of the sintered body according to Example 11 (taken at a magnitude of 3000). FIG. 6 is a photograph obtained by image processing the photograph of FIG. 5. FIG. 7 is a photograph showing the microstructure of the sintered body according to Example 14 (taken at a magnitude of 3000). FIG. 8 is a photograph obtained by image processing the photograph of FIG. 7.

(Comparative Examples 1 to 3: Tables 4, 5 and 6)

In Comparative Example 1, AlN raw powder with 0.020 mole percent of added Sm$_2$O$_3$ was sintered at 1800° C. to provide a dense body with a density of 3.26 g/cm$^3$ and an open porosity of 0.04 percent. The converted content of Sm$_2$O$_3$ was 0.022 mole percent. A ratio of the converted content of Sm calculated as Sm$_2$O$_3$ to a calculated content of aluminum oxide (Sm$_2$O$_3$/Al$_2$O$_3$) (molar ratio) was 0.033. The mean grain diameter of aluminum nitride particles was 4 μm, and SmAlO$_3$/AlN (ratio of peak strengths) was 0.0 percent. The volume resistivity was 4.0×10$^{15}$ Ω·cm at room temperature (25° C.).

Figure 9:
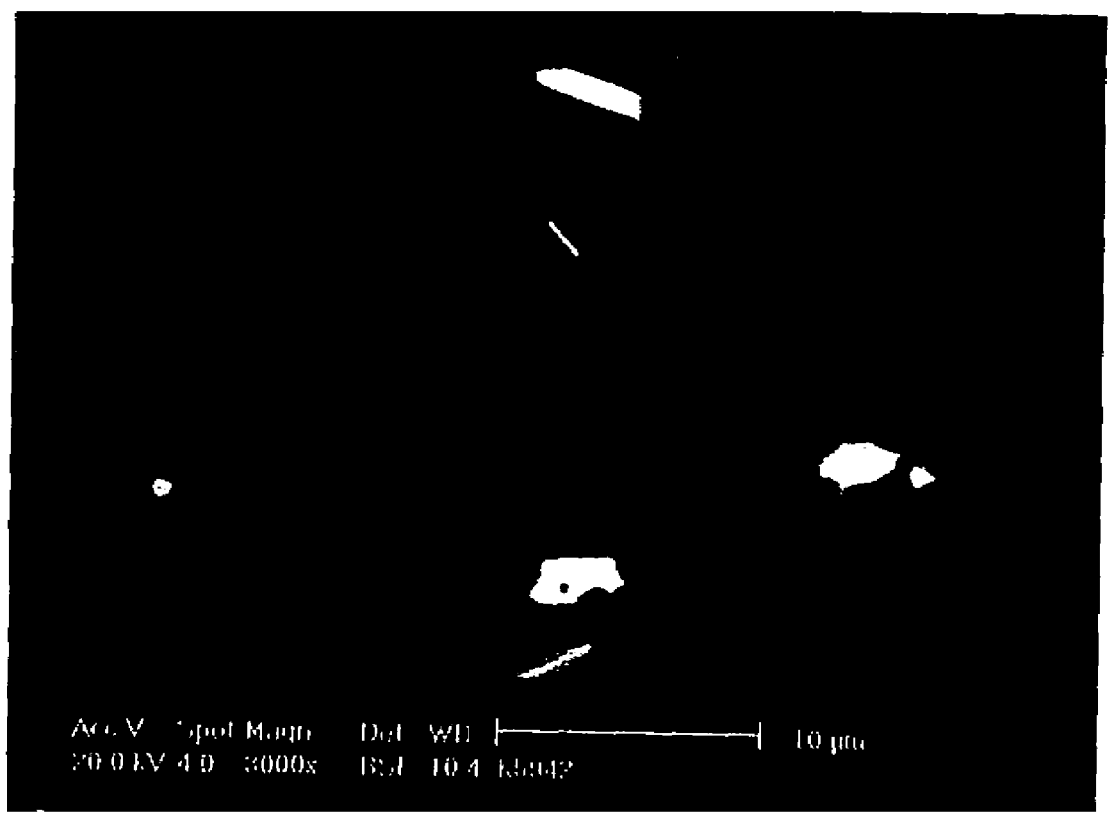
FIG. 9 is a photograph (after image processing) showing the microstructure of a sintered body according to Comparative Example 1.
Figure 10:
FIG. 10 is a photograph obtained by image processing the photograph of FIG. 9.

FIG. 9 is a photograph showing the microstructure of the sintered body according to Comparative Example 1 (taken at a magnitude of 3000). FIG. 10 is a photograph obtained by image processing the photograph shown in FIG. 9. The intergranular phase is isolated and does not have an elongate shape or pattern so that the intergranular phase was not continuously and three-dimensionally interconnected. The length of the intergranular phase was 4 μm.

In Comparative Example 2, the converted content of Sm$_2$O$_3$ was 0.200 mole percent, and larger than those in the inventive examples. The ratio of the converted content of Sm calculated as Sm$_2$O$_3$ to a calculated content of aluminum oxide (Sm$_2$O$_3$/Al$_2$O$_3$) was 0.274. The mean grain diameter of aluminum nitride particles was 4 μm, and the SmAlO$_3$/AlN (ratio of peak strengths) was 5.1 percent. The volume resistivity was as low as 3.0×10$^{11}$ Ω·cm at room temperature (25° C.). In Comparative Example 2, the content of Sm$_2$O$_3$ is large, so that this example is outside the scope of the present invention intended for reducing the volume resistivity at a low content of Sm$_2$O$_3$.

In Comparative Example 3, the converted content of Sm$_2$O$_3$ was 0.097 mole percent, which is larger that those in the inventive Examples. In Comparative Example 3, the mean grain diameter of aluminum nitride particles was 4 μm, and the SmAlO$_3$/AlN (ratio of peak strengths) was 2.8 percent. The volume resistivity was as low as 2.0×10$^{11}$ Ω·cm at room temperature (25° C.). The length of the intergranular phase was 12 μm. The content of Sm$_2$O$_3$ was also large also in Comparative Example 3.

As described above, the present invention provides an aluminum nitride ceramics having a low volume resistivity at room temperature and a relatively low content of samarium.

The present invention has been explained referring to the preferred embodiments, however, the present invention is not limited to the illustrated embodiments which are given by way of examples only, and may be carried out in various modes without departing from the scope of the invention.

The invention claimed is:

1. An aluminum nitride ceramic comprising aluminum nitride as a main component and samarium in a converted content calculated as samarium oxide of not higher than 0.060 mole percent, wherein said aluminum nitride ceramic includes aluminum nitride particles and a samarium-aluminum composite oxide phase having a length of at least 7 μm;
   wherein said samarium-aluminum composite oxide phase includes SmAl$_{11}$O$_{11}$O$_{18}$ phase; and
   wherein a molar ratio of said converted content of samarium calculated as samarium oxide to a calculated content of aluminum oxide (Sm$_2$O$_3$/Al$_2$O$_3$) is in a range of 0.01 to 0.05.

2. The aluminum nitride ceramic of claim 1, having a volume resistivity at room temperature of 1×10$^{12}$·cm or lower.

3. The aluminum nitride ceramic of claim 1, wherein a content of a SmAlO$_3$ phase in said samarium-aluminum composite oxide phase is 2 percent or lower calculated according to the following formula based on an X-ray diffraction profile: said content of SmAlO$_3$ phase=(integrated strength of a strongest peak of said SmAlO$_3$ phase/integrated strength of a strongest peak of said aluminum nitride phase)×100 percent.

4. The aluminum nitride ceramic of claim 1, wherein said samarium-aluminum composite oxide phase forms a network microstructure.

5. The aluminum nitride ceramic of claim 1, wherein said converted content of samarium calculated as samarium oxide is at least 0.025 mole percent.

6. The aluminum nitride ceramic of claim 1, wherein said aluminum nitride particles have a mean particle diameter of at least 5 μm or more.

7. A member for producing semiconductors comprising said aluminum nitride ceramic of claim 1.

8. An aluminum nitride ceramic comprising aluminum nitride as a main component and samarium in a converted content calculated as samarium oxide of 0.060 mole percent or lower, wherein said aluminum nitride ceramic includes aluminum nitride particles and a samarium-aluminum composite oxide phase, said samarium-aluminum composite oxide phase having a length of at least 7 μm, wherein said aluminum nitride ceramic is obtained by a sintering process at a maximum temperature of at least 1850° C.

9. The aluminum nitride ceramic of claim 8, having a volume resistivity at room temperature of $1 \times 10^{12}$ Ω·cm or lower.

10. The aluminum nitride ceramic of claim 8, wherein said aluminum nitride particles have a mean grain diameter of at least 5 μm.

11. The aluminum nitride ceramic of claim 8, wherein said samarium-aluminum composite oxide phase includes a $SmAl_{11}O_{18}$ phase.

12. The aluminum nitride ceramic of claim 8, wherein a content of a $SmAlO_3$ phase in said samarium-aluminum composite oxide phase is 2 percent or lower calculated according to the following formula based on an X-ray diffraction profile: said content of $SmAlO_3$ phase=(integrated strength of a strongest peak of said $SmAlO_3$ phase/integrated strength of a strongest peak of said aluminum nitride phase)×100 percent.

13. The aluminum nitride ceramic of claim 8, wherein a molar ratio of said converted content of samarium calculated as samarium oxide to a calculated content of aluminum oxide ($Sm_2O_3/Al_2O_3$) is in a range of 0.01 to 0.05.

14. The aluminum nitride ceramic of claim 8, wherein said samaritan-aluminum oxide phase forms a network microstructure.

15. A member for producing semiconductors comprising said aluminum nitride ceramic of claim 8.

* * * * *

UNITED STATES PATENT AND TRADEMARK OFFICE
CERTIFICATE OF CORRECTION

PATENT NO. : 7,148,166 B2
APPLICATION NO. : 10/704997
DATED : December 12, 2006
INVENTOR(S) : Naomi Teratani and Yuji Katsuda It is certified that error appears in the above-identified patent and that said Letters Patent is hereby corrected as shown below:

Column 15
  Line 47: After "percent." add --The converted content of $Sm_2O_3$ was 0.032 mole percent. A ratio of the converted content of Sm calculated as $Sm_2O_3$ to a calculated content of aluminum oxide ($Sm_2O_3/Al_2O_3$) (molar ratio) was 0.034. The mean grain diameter of aluminum--
  Line 50: After ""3.1" delete "The converted content of $Sm_2O_3$ was 0.032 mole percent. A ratio of the converted content of Sm calculated as $Sm_2O_3$ to a calculated content of aluminum oxide ($Sm_2O_3/Al_2O_3$) (molar ratio) was 0.034. The mean grain diameter of aluminum"

Column 18
  Line 52: Change "$SmAl_{11}O_{11}O_{18}$" to --$SmAl_{11}O_{18}$--
  Line 58: Change "$1 \times 10^{12} \cdot cm$" to --$1 \times 10^{12} \Omega \cdot cm$--

Column 20
  Line 19: Change "samaritan-aluminum" to --samarium-aluminum--

Signed and Sealed this

Twentieth Day of February, 2007

JON W. DUDAS
*Director of the United States Patent and Trademark Office*